United States Patent
Martin

(10) Patent No.: US 6,561,693 B1
(45) Date of Patent: May 13, 2003

(54) REMOTE TEMPERATURE SENSING LONG WAVE LENGTH MODULATED FOCAL PLANE ARRAY

(75) Inventor: Robert J. Martin, Orlando, FL (US)

(73) Assignee: Lockheed Martin Corporation, Bethesda, MD (US)

( * ) Notice: Subject to any disclaimer, the term of this patent is extended or adjusted under 35 U.S.C. 154(b) by 71 days.

(21) Appl. No.: 09/666,297

(22) Filed: Sep. 21, 2000

(51) Int. Cl.[7] .............................. G01J 5/10; G01V 3/00; G01K 7/00; H01L 29/00

(52) U.S. Cl. ................. 374/121; 257/467; 250/581; 250/560; 250/484.4; 374/163

(58) Field of Search .................. 374/121, 120, 374/134, 163; 250/268, 269.1, 581, 560, 484.2–484.5, 370.01–370.15; 257/467, 14

(56) References Cited

U.S. PATENT DOCUMENTS

| | | | |
|---|---|---|---|
| 3,812,422 A | 5/1974 | Carolis | 324/58.5 |
| 3,900,260 A | 8/1975 | Wendt | 356/5.12 |
| 3,995,212 A | 11/1976 | Ross | 324/58.5 B |
| 4,044,355 A | 8/1977 | Evardsson | 342/124 |
| 4,435,709 A | 3/1984 | Kipp | 342/101 |
| 4,568,960 A * | 2/1986 | Petroff et al. | 357/30 |
| 4,779,004 A * | 10/1988 | Tew et al. | 250/578 |
| 4,903,101 A | 2/1990 | Maserjian | |
| 4,956,686 A | 9/1990 | Borrello et al. | |
| 4,972,386 A | 11/1990 | Lau | 367/99 |
| 5,013,918 A | 5/1991 | Choi | |
| 5,047,822 A | 9/1991 | Little, Jr. et al. | |
| 5,157,337 A | 10/1992 | Neel et al. | 324/632 |
| 5,198,659 A | 3/1993 | Smith et al. | |
| 5,198,682 A * | 3/1993 | Wu et al. | 257/21 |
| 5,300,780 A | 4/1994 | Denney et al. | |
| 5,355,000 A | 10/1994 | Delacourt et al. | |
| 5,365,178 A | 11/1994 | Van Der Pol | 324/644 |
| 5,373,182 A * | 12/1994 | Norton | 257/440 |
| 5,384,469 A | 1/1995 | Choi | |
| 5,440,310 A | 8/1995 | Schreiner | 342/124 |
| 5,457,331 A * | 10/1995 | Kosai et al. | 257/188 |
| 5,488,504 A | 1/1996 | Worchesky et al. | |
| 5,539,206 A | 7/1996 | Schimert | |
| 5,552,603 A * | 9/1996 | Stokes | 250/370.12 |
| 5,629,522 A | 5/1997 | Martin et al. | |
| 5,656,774 A | 8/1997 | Nelson et al. | 73/290 |
| 5,659,321 A | 8/1997 | Burger et al. | 342/124 |
| 5,726,578 A | 3/1998 | Hook | 324/643 |
| 5,734,346 A | 3/1998 | Richardson et al. | 342/124 |

(List continued on next page.)

FOREIGN PATENT DOCUMENTS

| JP | 09069731 A | 3/1997 | H03D/7/00 |
|---|---|---|---|
| SU | 697940 A | 3/1997 | G01R/23/02 |

OTHER PUBLICATIONS

W.A. Beck, et al., "Imaging Performance of 256×256 LWIR Miniband Transport Multiple Quantum Well Focal Plane Arrays", pp. 1–14, Proc. Second Int. Symp. 2–20 μm Wavelength Infrared Dets. and Arrays: Phys. and Appl., Oct. 10–12, 1994, Miami Beach, Florida.

(List continued on next page.)

*Primary Examiner*—Diego Gutierrez
*Assistant Examiner*—Gail Verbitsky
(74) *Attorney, Agent, or Firm*—Burns, Doane, Swecker & Mathis, LLP

(57) ABSTRACT

An infrared photo-detector focal plane array includes detectors with quantum well layers that are spectrally "tuned" to impinging radiation by modulating the voltage biases applied across each quantum well layer. Read out circuits, interfaced with each detector of the array, process the photo-currents received from each detector to determine the absolute temperature of the remote infrared source from which the impinging radiation originated.

15 Claims, 4 Drawing Sheets

U.S. PATENT DOCUMENTS

| | | | | |
|---|---|---|---|---|
| 5,808,329 | A | * 9/1998 | Jack et al. | 257/188 |
| 5,808,350 | A | * 9/1998 | Jack et al. | 257/440 |
| 5,818,052 | A | * 10/1998 | Elabd | 250/370.09 |
| 5,965,899 | A | 10/1999 | Little, Jr. | |
| 6,028,323 | A | * 2/2000 | Liu | 257/21 |
| 6,034,407 | A | * 3/2000 | Tennant et al. | 257/440 |
| 6,104,046 | A | * 8/2000 | Borenstain | 257/187 |
| 6,111,266 | A | * 8/2000 | Carline et al. | 257/22 |
| 6,130,637 | A | 10/2000 | Meszaros et al. | 342/124 |
| 6,157,042 | A | * 12/2000 | Dodd | 257/21 |
| 6,166,681 | A | 12/2000 | Meszaros et al. | 342/124 |
| 6,184,818 | B1 | 2/2001 | Meinel | 342/124 |
| 6,198,101 | B1 | * 3/2001 | Brown et al. | 250/338.4 |
| 6,198,424 | B1 | 3/2001 | Diede et al. | 342/22 |
| 6,211,529 | B1 | * 4/2001 | Gunapala et al. | 257/17 |
| 6,355,939 | B1 | * 3/2002 | Dodd | 257/21 |
| 2002/0008191 | A1 | * 1/2002 | Faska et al. | 250/208.1 |

OTHER PUBLICATIONS

Lester J. Kozlowski, et al., "LWIR 128×128 GaAs/AlGaAs Multiple Quantum Well Hybrid Focal Plane Array", IEEE Translation on Electron Devices, vol. 38, No. 5, May 1991, pp. 1124–1130.

A Köck, et al., "Double Wavelength Selective GaAs/AlGaAs Infrared Detector Device", Applied Physics Letters 60(16), Apr. 20, 1992, pp. 2011–2013.

I. Gravé, et al., "Voltage–Controlled Tunable GaAs/AlGaAs Multistack Quantum Well Infrared Detector", Applied Physics Letters 60 (19), May 11, 1992, pp. 2362–2364.

E. Martinet, et al., "Switchable Bicolor (5.5–9.0 μm) Infrared Detector Using Asymmetric GaAs/AlGaAs Multiquantum Well", Applied Physics Letters 61(3), Jul. 20, 1992, pp. 246–248.

K. Kheng, et al., "Two–Color GaAs/(AlGa)As Quantum Well Infrared Detector With Voltage–Tunable Spectral Sensitivity At 3–5 and 8–12 μm", Applied Physics Letters 61(6), Aug. 10, 1992, pp. 666–668.

K.L. Tsai, et al., "Two–Color Infrared Photodetector Using GaAs/AlGaAs and Strained InGaAs/AlGaAs Multiquantum Wells", Applied Physics Letters 62 (26_, Jun. 28, 1993, pp. 3504–3506.

B.F.Levine, "Quantum–Well Infrared Photodetectors", Jornal of Applied Physics 74 (8), Oct. 15, 1993, pp. 1–87.

C.G. Bethea, et al., "Long Wavelength Infrared 128×128 $Al_xGa_{1-x}As$/GaAs Quantum Well Infrared Camera and Imaging System", IEEE Transactions on Electron Devices, vol. 40, No. 11, Nov. 1993, pp. 1957–1963.

G. Sarusi, et al., "Improved Performance of Quantum Well Infrared Photodetectors Using Random Scattering Optical Coupling", Applied Physics Letters 64 (8), Feb. 21, 1994, pp. 960–962.

Y.H. Wang, et al., "A GaAs/AlAs/AlGaAs and GaAs/AlGaAs Stacked Quantum Well Infrared Photodetector For 3–5 and 8–14 μm Detection", Journal of Applied Physics 76(4), Aug. 15, 1994, pp. 2538–2540.

M.Z. Tidrow, et al., "Grating Coupled Multicolor Quantum Well Infrared Photodetectors", Applied Physics Letters 67 (13), Sep. 25, 1995, pp. 1800–1802.

C.J. Chen, et al., Corrugated Quantum Well Infrared Photodetectors For Normal Incident Light Coupling, Applied Physics Letter 68 (11), Mar. 11, 1996, pp. 1446–1448.

T.R. Schimert, et al., "Enhanced Quantum Well Infrared Photodetor With Novel Multiple Quantum Well Grating Structure", Applied Physics Letters 68 (20), May 13, 1996, pp. 2846–2848.

"Novel Methods of Measuring Impurity Levels in Liquid Tanks", LEEE MTT–S International Microwave Symposium Digest, US, New York, IEEE, pp. 1651–1654 (1997).

"Micropower Impulse Radar Technology and Application", by Mast et al., U.S. Dept. of Energy, Lawrence Livermore National Laboratory, UCRL–ID 130474 (Apr. 15, 1998).

"Radar Level Technology Offers Accurate, Noncontact Measurements" by Fred Fitch, Special Report Flow, Level, Pressure, I&CS, pp. 27–30 (Jan. 1996).

"Gauging and Level Measurement for Liquids, Interface and Granular Materials", *Reflex–Radar,* Krohne, Technical Data BM 100, BM 100 EEx (12/96).

"Low–Cost Wideband Spread–Spectrum Device Promises to Revoluionize Radar Proximity Sensors", *Technology Advances,* Electronic Design (Jul. 25, 1994.

"Eclipse Guided Wave Radar", Magnetrol, printed from (Jul. 23, 1998).

"Approval Standard Intrinsically Safe Apparatus and Associated Apparatus for use in Class I, II and III, Division 1 Hazardous (Classified) Locations", Factory Mutual Research, Class No. 3610, pp. 1–70 (Oct. 1988).

"Measuring Fluid Levels with Radar", by Steven Ashley, *Mechanical Engineering,* pp. 82–83 (Jan. 1996).

"World's Fastest Solid–State Digitizer", Lawrence Livermore National Laboratory, *Energy & Technology Review,* pp. S1–S6 (Apr. 1994).

* cited by examiner

REMOTE TEMPERATURE SENSING LONG WAVE LENGTH MODULATED FOCAL PLANE ARRAY

The present application is related to application Ser. No. 09/666,847, entitled "Three Color Quantum Well Focal Plane Arrays", application Ser. No. 09/666,828, entitled "Programmable Hyper-Spectral Infrared Focal Plane Array," application Ser. No. 09/666,301, entitled "Two Color Quantum Well Focal Plane Arrays," application Ser. No. 09/665,959, entitled "Clutter Discriminating Focal Plane Array," and application Ser. No. 09/666,296, entitled "Large Dynamic Range Focal Plane Array," all filed on even date herewith. The disclosures of the above identified Patent applications are herein incorporated by reference.

BACKGROUND OF THE INVENTION

1. Field of the Invention

The present invention is directed generally to quantum well infrared photodetector focal plane arrays (QWIP FPA's) and, more particularly, to QWIP FPAs that are capable of detecting multiple colors for determining the temperature of a remote infared source.

2. Background Information

Multicolor infrared detection capability has wide applicability to a number of different applications including aerospace, medical, surveying, mining, and agriculture. For example, multicolor infrared detection can provide useful information during, geographical surveys. Detection in at least two infrared (IR) spectral bands would permit differentiation between man-made structures and natural landscape in a geographical survey. Additionally, in medical applications, multi-color detection would permit improved thermal imaging of the human body for diagnostic purposes.

Multicolor infrared detection has been conventionally performed using a wide-band IR detector and an associated rotating mechanical multicolor filter wheel. The wide-band IR detector detects a broad range of incident wavelengths. The rotating filter wheel selects the desired wavelength that is to be passed to the wide-band detector. An exemplary mechanical color filter wheel system is disclosed in U.S. Pat. No. 5,300,780. Mechanical color wheel systems, however, suffer from a number of deficiencies in multicolor detection. Such systems generally are slow and bulky, require large amounts of power for operation, and have a limited life span. Additionally, color wheel systems tend to have poor photon collection efficiency.

To alleviate some of the known deficiencies of mechanical color filter wheel systems, quantum well photodetectors have been constructed that permit the detection of more than one spectral band. Such detectors are described, for example, in U.S. Pat. Nos. 5,384,469 and 4,903,101. These patents generally disclose the use of a varying bias across a multiple quantum well detector so as to "tune" the spectral responsivity of the detector. Thus, in these patents, the "color" or spectral band that is detected by the quantum well detector is a function of the applied bias voltage. These patents, however, do not disclose the use of multi-color detection for determining the absolute temperature of a remote infrared source. The sensing of the absolute temperature of a remote infrared source can be advantageous in many applications.

Accordingly, there exists a need in the art for a quantum well photo-detector focal plane array that has multi-color capability and which can use the multi-color capability to determine the absolute temperature of remote infrared sources.

SUMMARY OF THE INVENTION

Determination of the absolute temperature of remote infrared sources using multi-color detection is achieved in the following exemplary embodiments of the invention. An infrared photo-detector focal plane array includes detectors with quantum well layers that are spectrally "tuned" to impinging radiation by modulating the voltage biases applied across each quantum well layer. Read out circuits, interfaced with each detector of the array, process the photo-currents received from each detector to determine the absolute temperature of the remote infrared source from which the impinging radiation originated.

One exemplary embodiment of the present invention is directed to a method of determining a temperature of a remote radiation source comprising the steps of: receiving radiation from said remote source at a detector structure; applying a plurality of bias voltages to said detector structure; obtaining quantities of moving charges in response to said plurality of applied bias voltages; and determining the temperature of said remote radiation source using said quantities of moving charges.

An additional exemplary embodiment of the present invention is directed to a a photo sensitive device comprising: a photodetector for receiving impinging radiation; a voltage source for applying a plurality of bias voltage levels to said photodetector; and a read out circuit for processing moving charges received from said photodetector in response to said impinging radiation and said plurality of bias voltage levels, wherein said read out circuit processes said moving charges in separate circuit paths and wherein each of said separate circuit paths is associated with one of said plurality of bias voltage levels.

A further exemplary embodiment of the present invention is directed to a photo-detector array comprising: a plurality of detector structures for receiving impinging radiation; one or more voltage sources for applying a plurality of voltage levels to each of said plurality of detector structures; and a plurality of read out circuits, wherein each read out circuit processes moving charges, received from an associated detector structure, in separate circuit paths and wherein each of said separate circuit paths is associated with one of said plurality of voltage levels.

An additional exemplary embodiment of the present invention is directed to a method of determining a temperature of a remote radiation source comprising the steps of: receiving radiation from said remote source at a photosensitive device; supplying a first quantity of charges from said photosensitive device to a first charge storage device; supplying a second quantity of charges from said photosensitive device to a second charge storage device; and determining the temperature of said remote radiation source using said first and second quantities of charges.

BRIEF DESCRIPTION OF THE DRAWINGS

Other objects and advantages of the invention will be apparent to those skilled in the art reading the following detailed description of the preferred embodiments in conjunction with the drawings in which like reference numbers have been used to indicate like elements, and wherein.

DETAILED DESCRIPTION OF THE PREFERRED EMBODIMENTS

Figure 1:
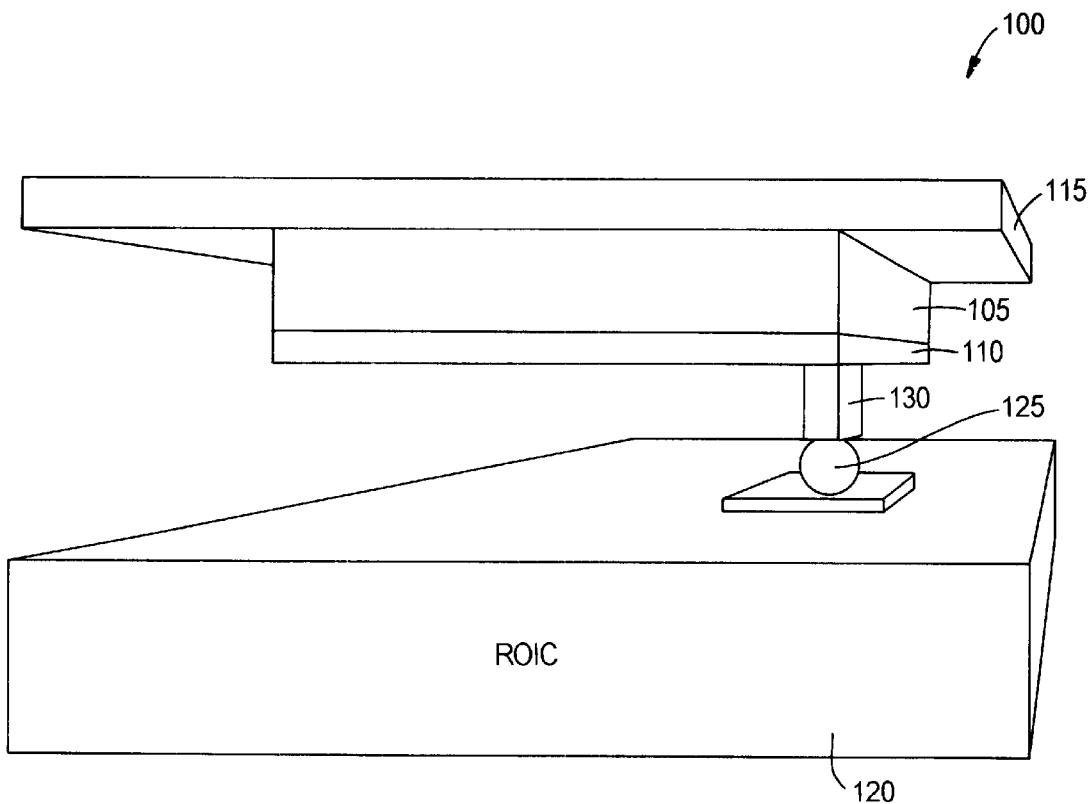
FIG. 1 is a structural diagram of a detector structure and associated Read Out Integrated Circuit (ROIC) in accordance with an exemplary embodiment of the present invention.

Multicolor detection in exemplary embodiments of the invention is achieved by varying the voltage bias applied across the quantum well layers of each detector structure in a focal plane array. Quantum Well Infrared Photo-detectors (QWIP FPA's) are typically composed of arrays of detector structures, wherein each detector structure produces a signal that is transmitted through a conductive bump to an external Read Out Integrated Circuit (ROIC) unit cell. The outputs of the plurality of ROIC unit cells associated with each detector in the array produce an integrated representation of the signal from the detector. To produce this output signal, a fixed bias is applied to the detector and the detector photo-current resulting from the bias and the incident radiation is integrated. This integration function is performed by an integration charge well (integration capacitor) that is disposed within each individual ROIC unit cell. The combined integrated outputs of the plurality of ROIC unit cells in the array produce an image corresponding to the received infrared radiation.

Multicolor detection can be achieved using the detector array structure described above by modulating the bias voltage applied across the quantum well layer of the detector structure. In accordance with known principles, modulation of the bias across the quantum well layer will vary the spectral response of the quantum well from the nominal peak wavelength set by the vertical depth of the quantum well layer. Based on well known physical principles, the vertical depth of the quantum well determines the energy required from impinging photons to permit carriers in the well to escape for conduction. The vertical depth of the quantum well thus determines the nominal spectral response of the detector to radiation in the form of impinging photons of various wavelengths. The allowed energy states in a quantum well are:

$$E_n = \frac{h^2 n^2}{8ml^2} \text{ Joules} \qquad \text{Eqn. (1)}$$

where h is Planck's constant=$6.626*10^{-34}$ Joule*seconds m is the effective mass of the carrier n is an integer n=1, 2, 3 . . .

$E_n$ is the energy of a given band in Joules l is the depth of the quantum well in meters.

For a carrier to move between the valence band (n=1) and the conduction band (n=2), the following energy $E_{1,2}$ is required to free the carrier from the valence band:

$$E_{1,2} = E_g = \frac{h^2(2^2 - 1^2)}{8ml^2} = \frac{3h^2}{8ml^2} \text{ Joules} \qquad \text{Eqn. (2)}$$

The energy required to free the carrier from the valence band to the conduction band ($E_{1,2}$) is alternatively called the energy gap, $E_g$. The energy given up by an impinging photon must be equal to or larger than the energy gap. Photon energy is related to the wavelength of the photon by the following:

$$E_g = \frac{hc}{\lambda_p} \text{ Joules} \qquad \text{Eqn. (3)}$$

where c is the velocity of light=$3*10^8$ meters/second (in a vacuum) $\lambda_p$ is the peak wavelength corresponding to the middle of the band in meters.

By setting the photonic energy equal to the energy gap $E_g$ between the bands, the relationship of the well depth to the peak wavelength $\lambda_p$ needed to free carriers is demonstrated:

$$\lambda_p = \frac{8mcl^2}{3h} \text{ meters} \qquad \text{Eqn. (4)}$$

Eqn. (4) is based on a general model, and those skilled in the art will recognize that other factors can influence the proportionality constant between wavelength and well depth. However, the peak wavelength can generally be considered proportional to the well depth:

$$\lambda_p = a_0 l^2 \text{ meters} \qquad \text{Eqn. (5)}$$

where $a_0$ is a proportionality constant Thus, it is evident by Eqn. (5) that the nominal spectral response of the quantum well can be "tuned" by altering the well's depth.

FIG. 1 illustrates a structure 100 of a single detector in a focal plane array according to an exemplary embodiment of the invention where the depths of the one or more quantum wells comprising the quantum well layer 105 have been adjusted to select a desired nominal peak wavelength. The structure is formed using a means responsive to impinging energy, or radiation, of a specified spectral band, represented in the FIG. 1 embodiment as quantum well layer 105. Quantum well layer 105 can include multiple sub-layers comprising alternating barrier sub-layers and quantum well sub-layers. Additionally, first contact layer 110, doped to a first conductivity, and second contact layer 115, doped to a second conductivity, are formed on either side of quantum well layer 105. Contact layers 110 and 115 can be composed of, for example, doped GaAs (e.g., n+GaAs), though one skilled in the art will recognize that other suitable contact layer materials may be used. The quantum well layer 105 can be comprised of, for example, a 20-period GaAs/$Al_xGa_{1-x}As$ multi-quantum well stack with the GaAs well depths and Al compositions adjusted to yield the desired peaks and spectral widths. One skilled in the art will recognize, however, that other multi-quantum well stacks can be used such as, for example, those used in U.S. Pat. No. 5,539,206 to Schimert, the disclosure of which is incorporated by reference herein. Additionally, one skilled in the art will further recognize that various doping concentrations for the quantum wells and contact layers can be used in exemplary embodiments of the invention. For example, doping concentrations such as those disclosed in the above-identified U.S. Patent to Schimert can be used in the present invention. Furthermore, the formation of each layer of the detector can be performed using any conventional techniques appropriate for the layer being established including, but not limited to, growth or deposition techniques.

The electrical connection for interfacing between the detector structure 100 and the read out integrated circuit (ROIC) 120 can further be seen in FIG. 1. This electrical connection is comprised of an interface bump 125 that is connected through a metal post 130 to the doped contact layer 110. As shown, the interface bump 125 provides the electrical connection to the underlying ROIC unit cell structure 120.

The quantum well layer 105 of FIG. 1 can additionally be comprised of one or more asymmetric quantum wells. Asymmetric quantum wells are known in the art as is indicated by U.S. Pat. No. 5,355,000 and the journal article by Martinet et al., "Switchable Bicolor (5.5–9.0 μm) Infrared Detector Using Asymmetric GaAs/AlGaAs Multiquantum well," Appl. Phys. Lett. 61 (3), Jul. 20, 1992, the disclosures of which are herein incorporated by reference. Using asymmetric quantum wells, the spectral response of the quantum well layer can be tuned from the nominal wavelength $\lambda_p$ of Eqn. (5) through the known phenomenon called "band splitting." "Band splitting" can be induced in an asymmetric multiple quantum well through the application of an electric field across the quantum well. In the lowest energy state in an asymmetric quantum well, for example, this "band splitting" is represented by the following equation:

$$E_2 - E_{1+v} = \frac{h^2((2-v)^2 - (1+v)^2)}{8mL^2} \text{ joules} \quad \text{Eqn. (6)}$$

where v is proportional to the applied bias voltage and represents the "split in the band."

Therefore, the peak wavelength needed to free carriers with an applied bias voltage is the following:

$$\lambda_p = \frac{8L^2 cm}{((2-\mathscr{E})^2 - (1+\mathscr{E})^2)h} \text{ meters} \quad \text{Eqn. (7)}$$

or, in simplified form:

$$\lambda_p = \frac{8L^2 cm}{9(1-2\mathscr{E})^2 h} \text{ meters} \quad \text{Eqn. (8)}$$

where $\mathscr{E}$ is the normalized electric field.

Thus, the peak wavelength $\lambda_p$ can be represented generally by the following equation:

$$\lambda_p = \frac{BL^2}{(1-v/3)^2} \text{ meters} \quad \text{Eqn. (9)}$$

where v is the applied bias in volts and B is a constant. Eqn. (9) above therefore demonstrates that the peak wave length of a quantum well can be "tuned" from a nominal wavelength $\lambda_p$, that is initially set by the depth of each quantum well in the layer, by modulating the bias voltage one across the layer comprising one or more asymmetric quantum wells. This is called the quadratic Stark effect.

Using the Stark effect, a quantum well layer, such as layer 105 of FIG. 1 for example, can be "tuned" to a plurality of peak wavelengths to enable the detection of infrared radiation in multiple spectral bands. To provide photo-currents from quantum well layer 105 in multiple spectral bands, the exemplary ROIC circuitry 200 shown in FIG. 2 makes use of the Stark effect produced by a modulated detector bias voltage. Maintenance of a detector bias voltage across quantum well layer 105 is provided by direct injection transistor 225 and detector common voltage $V_{Detcom}$ 235. To "tune" the spectral response of the quantum well layer 105, the voltage bias across the layer can be modulated by changing the injection transistor gate bias voltage 230 or by changing the detector common voltage $V_{Detcom}$ 235.

The read out circuitry 200 shown uses two separate circuit paths for processing the photo-current derived from the quantum well layer 105 of FIG. 1. One circuit path processes the photo-current when the quantum well is "tuned" to a first spectral band over a first time period and the other circuit path processes the photo-current when the quantum well is "tuned" to a second spectral band over a second time period. The processing of the photo-current from the quantum well layer uses a "cup" and "bucket" technique where the charge well capacitor $C_W$ 205 represents the charge "cup" and the charge hold capacitors $C_{H1}$ 210 and $C_{H2}$ 215 represent the charge "buckets." The single "cup" and the two "buckets" operate in successive Dump-Ramp-Sample processes to integrate the photo-current from the quantum well layer and to provide voltages derived from the integrated photo-current to either input of the difference amplifier 220.

Figure 3:
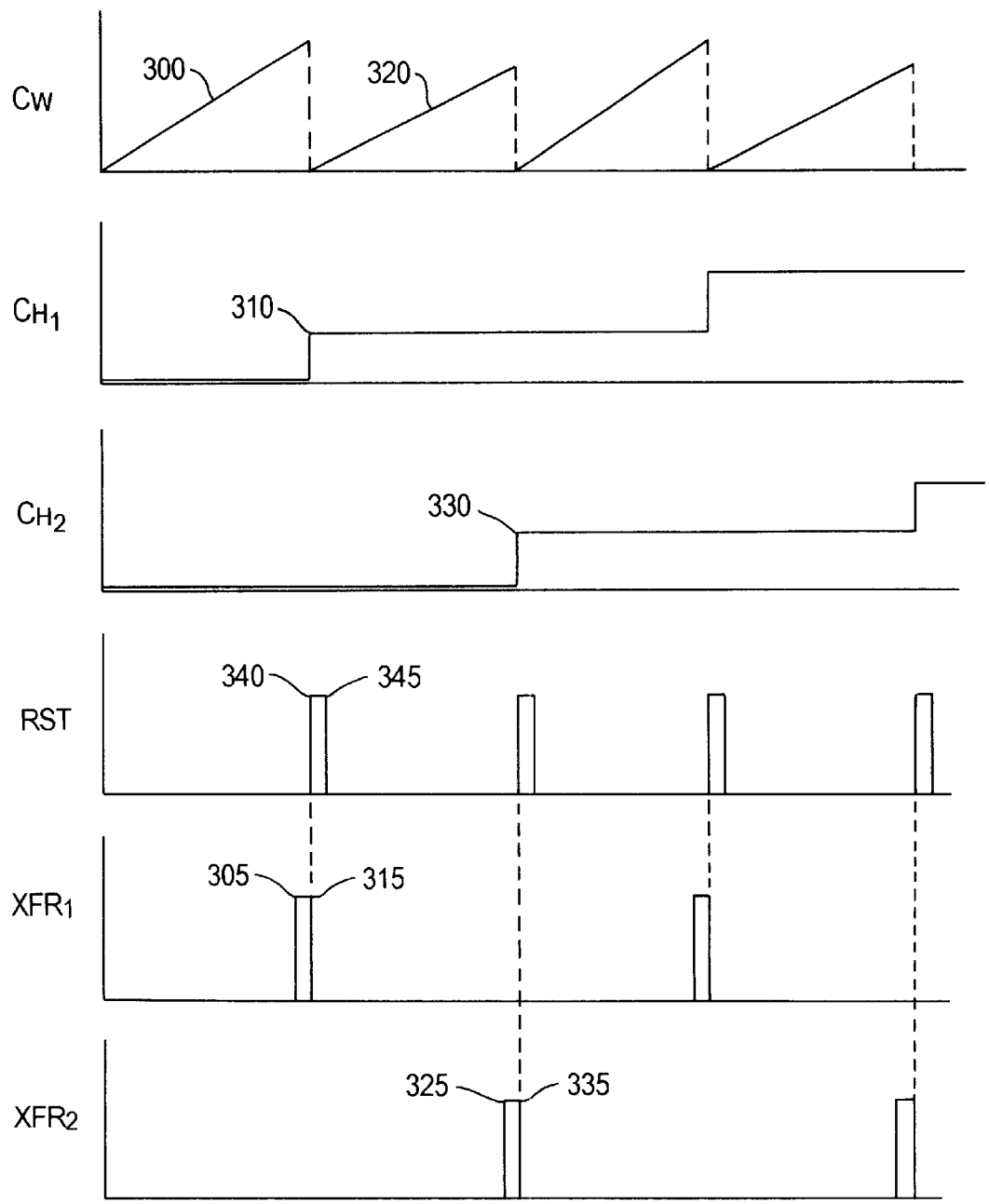
FIG. 3 is a timing diagram of the charge transfer process of an exemplary embodiment of the invention.

One cycle of the exemplary read out circuitry 200 operates in the following described manner. During a first dump-ramp-sample (DRS) process, the RST switch 240 is opened and the photo-current from the detector begins to cause charge to be accumulated (300, FIG. 3) in the charge well $C_W$ 205. When a sufficient quantity of charges is stored in charge well $C_W$ 205, switch $XFR_1$ 245 is closed (305, FIG. 3) to transfer the charges (310, FIG. 3) from the "cup" capacitor ($C_W$ 205) to the "bucket" capacitor ($C_{H1}$, 210). When the stored charge in the "cup" is sufficiently emptied into the "bucket," switch $XFR_1$ 245 is opened (315, FIG. 3). A voltage derived from the charges stored in $C_{H1}$ 210 is supplied, via the time division multiplexer 250, to difference amplifier 220.

After switch $XFR_1$ is opened, the RST switch 240 is closed (340, FIG. 3) for a first time period to "dump" any charge stored in charge well 205. The RST switch 240 is then opened (345, FIG. 3) and the photo-current from the detector begins to cause charge to be accumulated (320, FIG. 3) in the charge well $C_W$ 205. When a sufficient quantity of charges is stored in charge well $C_W$ 205, switch $XFR_2$ 260 is closed (325, FIG. 3) to transfer the charges (330, FIG. 3) from the "cup" capacitor ($C_W$ 205) to the "bucket" capacitor ($C_{H2}$, 215). When the stored charge in the "cup" is sufficiently emptied into the "bucket," switch $XFR_2$ 260 is opened (335, FIG. 3). A voltage derived from the charges stored in $C_{H2}$ 215 is supplied, via the time division multiplexer 275, to difference amplifier 220.

One skilled in the art will recognize that the above described dump-ramp-sample capacitor filter arrangement can be replaced with a cup and bucket switched capacitor filter arrangement as described in U.S. Pat. No. 5,629,522, entitled "Apparatus for and Method of Providing Long Integration Times in an IR Detector," the disclosure of which is incorporated herein by reference.

After performance of the first and second DRS processes discussed above, difference amplifier 220 amplifies the voltages derived from the charges stored in both $C_{H1}$ and $C_{H2}$ to produce difference outputs +Temp 255 and −Temp 260. These difference outputs can be used for, among other purposes, determining the absolute temperature of the infrared source from which the radiation impinging upon the detector originated. Since the voltage difference between the +Temp 255 and −Temp outputs as a function of temperature is known, the absolute temperature of the remote infrared source can be determined by measuring the voltage difference between the +Temp 255 and −Temp 260 outputs.

Figure 2:
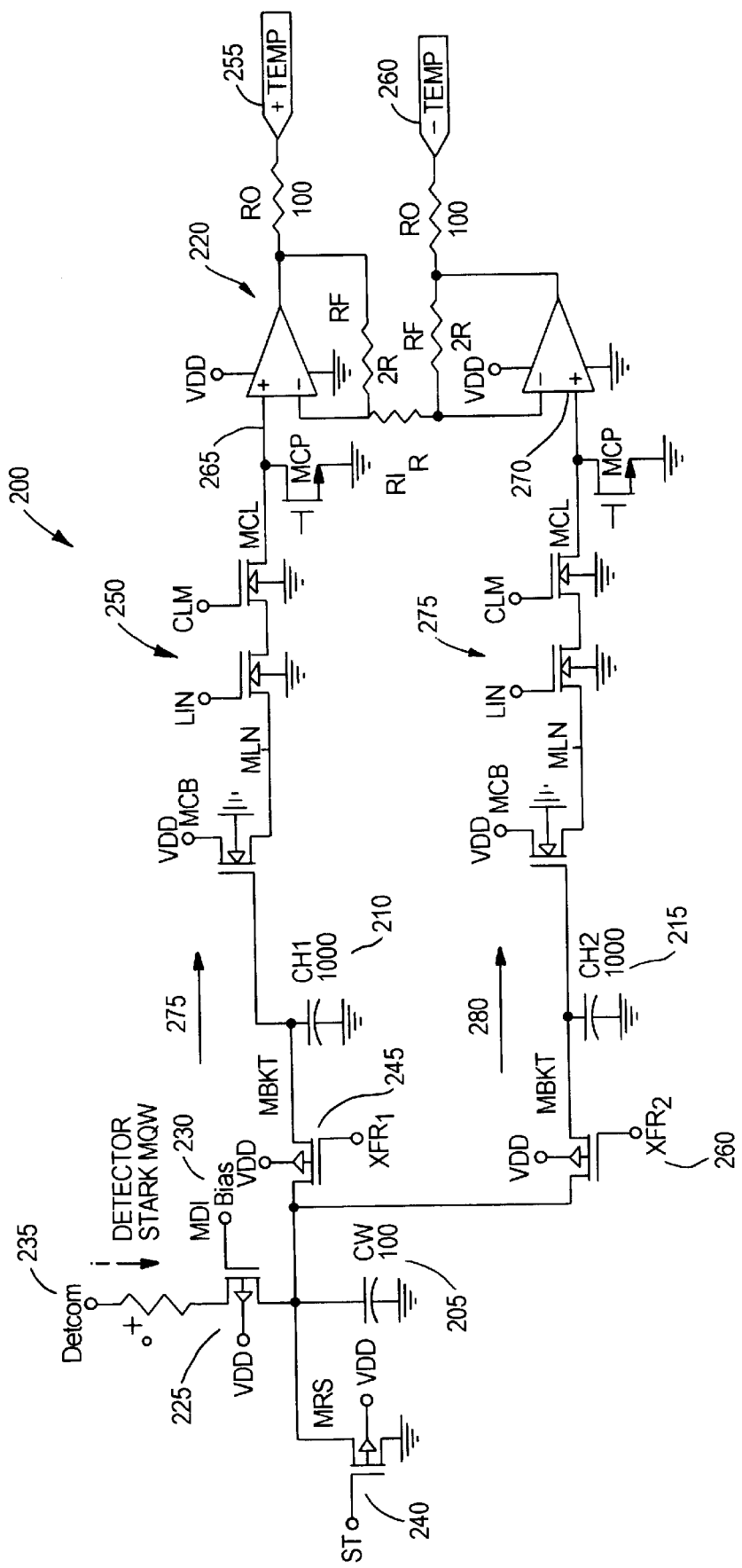
FIG. 2 is a schematic of a readout circuit in accordance with an exemplary embodiment of the invention.

In an additional exemplary embodiment, the absolute temperature of the remote infrared source can be determined by adjusting the operating parameters of the circuitry 200 in FIG. 2. In this embodiment, the transfer resistance gains of each circuit path 275 and 280 are adjusted to provide equal voltage responses at about ½ of the detector common voltage ($V_{Detcom}$) and at a desired temperature ($T_0$). The voltage response curve (e.g., the voltage at either input 265 or 270 of the difference amplifier 220) of each processing path in the circuit is represented by the following general equation:

$$V_\lambda = \frac{R_{Trans} A_{op} \tau_{op} R_{ip} H}{e^{\frac{T_r}{T}} - 1} \qquad \text{Eqn. (10)}$$

where $V_\lambda$=voltage of circuit path;
$R_{trans}$=transfer resistance gain;
$A_{op}$=Area of optics;
$\tau_{op}$=transmission of optics;
H=optical irradiance over the passband of the detector;
$T_r$=hc/k$\lambda$=reference temperature corresponding to peak wavelength $\lambda$;
T=infrared source temperature;
$\lambda$=peak wavelength of quantum well layer during portion of sampling cycle;
$R_{ip}$=$\lambda_p q \eta \beta$/hc=responsivity of detector,
where $\beta$=photoconductive gain;
$\eta$=quantum efficiency;
h=Planck's constant;
$\lambda_p$=passband of system;
q=electron charge;
c=velocity of light.

Since the spectral response of the quantum well is adjusted to two different peak wavelengths $\lambda_1$ and $\lambda_2$ during a sampling interval, the voltages at each input 265 and 270 of the difference amplifier of FIG. 2 are the following:

$$V_{\lambda 1} = \frac{R_{trans1} A_{op} \tau_{op} R_{ip1} H_1}{e^{\frac{T_{r1}}{T}} - 1} \qquad \text{Eqn. (11)}$$

$$V_{\lambda 2} = \frac{R_{trans2} A_{op} \tau_{op} R_{ip2} H_2}{e^{\frac{T_{r2}}{T}} - 1} \qquad \text{Eqn. (12)}$$

Equating $V_{\lambda 1}$ and $V_{\lambda 2}$:

$$V_{\lambda 1} = \qquad \text{Eqn. (13)}$$

$$\frac{R_{trans1} A_{op} \tau_{op} R_{ip1} H_1}{e^{\frac{T_{r1}}{T}} - 1} = V_{\lambda 2} = \frac{R_{trans2} A_{op} \tau_{op} R_{ip2} H_2}{e^{\frac{T_{r2}}{T}} - 1} = \frac{V_{Detcom}}{2}$$

and solving for the transfer resistance gains $R_{trans}$ for each circuit path:

$$R_{trans1} = \frac{V_{Detcom}}{2 * A_{op} \tau_{op} R_{ip1} H_1} \left( e^{\frac{T_{r1}}{T_o}} - 1 \right) \qquad \text{Eqn. (14)}$$

$$R_{trans2} = \frac{V_{Detcom}}{2 * A_{op} \tau_{op} R_{ip2} H_2} \left( e^{\frac{T_{r2}}{T_o}} - 1 \right) \qquad \text{Eqn. (15)}$$

produces the transfer resistance gains for each circuit path. Since, $T_0$, $V_{Detcom}$, $\lambda_1$, $\lambda_2$, $A_{op}$, $\tau_{op}$, H, and $R_{ip}$ are known, the transfer resistances $R_{trans1}$ and $R_{trans2}$ can be calculated. Further, given that $$R_{trans} = \frac{t_{integration}}{C_W} \qquad \text{Eqn. (16)}$$

the integration time $t_{integration}$ for each circuit path can be calculated that will provide the appropriate transfer resistance gain. The integration time $t_{integration}$ is set by adjusting the interval over which the charge well $C_W$ 205 is allowed to charge during either of the first or second DRS processes described above. By setting the integration times ($t_{integration1}$ and $t_{integration2}$) of each DRS process to achieve the transfer ($R_{trans1}$ and $R_{trans2}$), a "crossover" or "null" of the voltage responses can be achieved at a specified temperature. Thus, at a "null" voltage indication across the +Temp 255 and −Temp outputs, a known temperature is indicated. Additionally, subtraction of the voltage outputs +Temp 255 and −Temp achieves a nearly "linear" temperature scale that can be used to determine the absolute temperature of the remote source over a broad range of temperatures.

Figure 4:
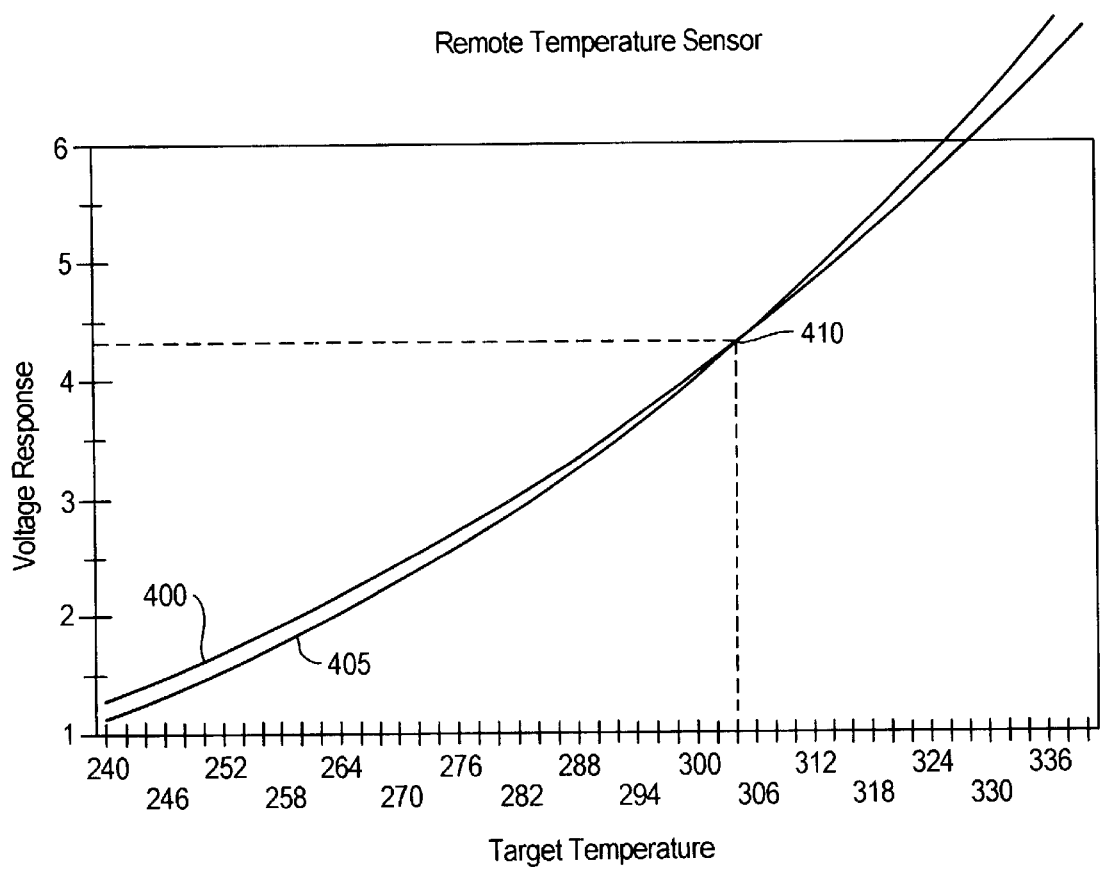
FIG. 4 is a plot of voltage response versus absolute temperature of an exemplary embodiment.

As one example of the above described process, FIG. 4 illustrates voltage response curves 400 and 405 of the invention where the transfer resistance gains of paths 275 and 280 (FIG. 2) have been adjusted to provide a "crossover" point 410 of the responses at about 4.3 Volts and at a source temperature of about 302 Kelvin.

In an additional exemplary embodiment of the invention, higher density focal plane arrays may be produced by removing the charge wells from the ROIC and fabricating the charge wells within the detector structure itself. The smaller pitch required of higher density arrays limits the usable area available for the charge wells in the ROIC underlying the detector structure. By fabricating the charge wells integrally to the detector itself, less space is required in the underlying ROIC and therefore higher densities can be achieved in the array. The technique of using integral charge wells is disclosed in U.S. patent application Ser. No. 09/149,483, entitled "Integral Charge Well for QWIP FPA's," the disclosure of which is herein incorporated by reference.

Optical coupling, in accordance with exemplary embodiments of the invention, can be achieved using a number of different techniques. Principles of quantum selection require that incident electromagnetic fields propagate in the horizontal plane of the quantum well. The incident flux must therefore be reflected inside the quantum well at an angle such that the flux passes through the material many times. In one exemplary embodiment, a rotated waffle diffraction grating is used, where the width of the waffle corresponds to one wavelength, the length of the waffle to another, and the diagonal to a third wavelength. The waffle grating, combined with a top side grating and side wall reflecting mirrors, constitute the optimum "photon in a box" quantum well detector optical system. Additionally, the waffle grating can be enhanced with a flux entry side anti-reflective coating composed of, for example, a quarter wavelength dielectric material. In addition to the waffle grating, one skilled in the art will recognize that a number of different techniques can be used for achieving optical coupling in the present invention. Such techniques include use of random gratings, reflectors, resonance structures, and so forth.

As one skilled in the art will recognize, a plurality of the detector structures described in the exemplary embodiments above can be formed across an etch stop layer to provide a detector structure array. This array will serve as a focal plane for optics of an IR imaging system. Such optics are conventionally known in the art and are not described here.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A method of determining a temperature of a remote radiation source comprising the steps of:
   receiving radiation from said remote source at a detector structure;
   applying a plurality of different bias voltages to said detector structure;
   obtaining quantities of moving charges in response to said plurality of applied bias voltages; and
   determining the temperature of said remote radiation source based on a difference between the quantities of moving charges.

2. The method of claim 1, wherein said plurality of different bias voltages comprises first and second bias voltages.

3. The method of claim 1, wherein a different spectral response of the detector structure is associated with each different one of said plurality of applied bias voltages.

4. The method of claim 1, wherein the plurality of different bias voltages are sequentially applied to the detector structure.

5. A photo sensitive device comprising:
   a photodetector for receiving impinging radiation;
   a voltage source for applying a plurality of different bias voltage levels to said photodetector; and
   a read out circuit for processing moving charges received from said photodetector in response to said impinging radiation and said plurality of different bias voltage levels, wherein said read out circuit processes said moving charges in separate circuit paths and wherein each of said separate circuit paths is associated with a different one of said plurality of bias voltage levels.

6. The photosensitive device of claim 5, wherein said photosensitive device determines an absolute temperature associated with said impinging radiation.

7. The method of claim 5, wherein the voltage source sequentially applies the plurality of different bias voltage levels to the photodetector.

8. The photo sensitive device of claim 5, wherein a different spectral response of the phototodetector is associated with each different one of said plurality of applied bias voltages.

9. A photo sensitive device comprising:
   a photodetector for receiving impinging radiation;
   a voltage source for applying a plurality of bias voltage levels to said photodetector; and
   a read out circuit for processing moving charges received from said photodetector in response to said impinging radiation and said plurality of bias voltage levels, wherein said read out circuit processes said moving charges in separate circuit paths and wherein each of said separate circuit paths is associated with one of said plurality of bias voltage levels;
   wherein said photosensitive device determines an absolute temperature associated with said impinging radiation.

10. A photo-detector array comprising:
    a plurality of detector structures for receiving impinging radiation;
    one or more voltage sources for applying a plurality of different voltage levels to each of said plurality of detector structures; and
    a plurality of read out circuits, wherein each read out circuit processes moving charges, received from an associated detector structure, in separate circuit paths and wherein each of said separate circuit paths is associated with a different one of said plurality of voltage levels.

11. The photo-detector of claim 10, wherein a different spectral response of each of the plurality of detector structures is associated with each different one of said plurality of voltage levels.

12. The photo-detector array of claim 10, wherein each of said read out circuits determines an absolute temperature associated with a portion of said impinging radiation received at an associated detector structure.

13. The method of claim 10, wherein the one or more voltage sources sequentially apply the plurality of different bias voltage levels to each of the plurality of detector structures.

14. A photo-detector array comprising:
    a plurality of detector structures for receiving impinging radiation;
    one or more voltage sources for applying a plurality of voltage levels to each of said plurality of detector structures; and
    a plurality of read out circuits, wherein each read out circuit processes moving charges, received from an associated detector structure, in separate circuit paths and wherein each of said separate circuit paths is associated with one of said plurality of voltage levels;
    wherein each of said read out circuits determines an absolute temperature associated with a portion of said impinging radiation received at an associated detector structure.

15. A method of determining a temperature of a remote radiation source comprising the steps of:
    receiving radiation from said remote source at a photosensitive device;
    supplying a first quantity of charges from said photosensitive device to a first charge storage device;
    supplying a second quantity of charges from said photosensitive device to a second charge storage device; and
    determining the temperature of said remote radiation source using said first and second quantities of charges.

* * * * *